(12) United States Patent
Zoels et al.

(10) Patent No.: US 8,923,022 B2
(45) Date of Patent: Dec. 30, 2014

(54) METHOD AND APPARATUS FOR CONTROLLING THERMAL CYCLING

(75) Inventors: Thomas Alois Zoels, Bayern (DE);
Henry Todd Young, Erie, PA (US);
Alvaro Jorge Mari Curbelo, Bavaria (ES)

(73) Assignee: General Electric Company, Schenectady, NY (US)

( * ) Notice: Subject to any disclaimer, the term of this patent is extended or adjusted under 35 U.S.C. 154(b) by 288 days.

(21) Appl. No.: 13/469,986

(22) Filed: May 11, 2012

(65) Prior Publication Data

US 2013/0301326 A1 Nov. 14, 2013

(51) Int. Cl.
*H02M 1/08* (2006.01)

(52) U.S. Cl.
USPC .............................................. 363/34; 327/378

(58) Field of Classification Search
CPC ....... H02M 1/08; H02M 1/084; H02M 5/453; H02M 5/458
USPC ................ 327/378, 512, 513; 363/34, 35, 37; 323/902
See application file for complete search history.

(56) References Cited

U.S. PATENT DOCUMENTS

| 5,877,646 A | 3/1999 | Jorg |
| 2005/0253165 A1 | 11/2005 | Pace et al. |
| 2007/0221994 A1 | 9/2007 | Ishikawa et al. |
| 2008/0007318 A1* | 1/2008 | Pace et al. .................... 327/396 |
| 2012/0218027 A1 | 8/2012 | Ioannidis |
| 2012/0221287 A1 | 8/2012 | Ioannidis |
| 2012/0221288 A1 | 8/2012 | Ioannidis |

FOREIGN PATENT DOCUMENTS

| DE | 102009015322 A1 | 10/2009 |
| EP | 0797301 A2 | 9/1997 |

OTHER PUBLICATIONS

Search Report and Written Opinion from corresponding PCT Application No. PCT/US2013/035548 dated Aug. 2, 2013.

* cited by examiner

*Primary Examiner* — Timothy J Dole
*Assistant Examiner* — Matthew Grubb
(74) *Attorney, Agent, or Firm* — GE Global Patent Operation; John A. Kramer (57) ABSTRACT

A method for reducing thermal cycling of a semiconductor power switch includes obtaining a value indicative of a junction temperature of the power switch. The method also includes selecting one of several pre-determined gate drive voltages, based on the obtained value, and providing the selected gate drive voltage to a gate of the power switch. This reduces thermal cycling of a power switch relative to the thermal cycling that would be present during operation at a single gate voltage.

18 Claims, 5 Drawing Sheets

METHOD AND APPARATUS FOR CONTROLLING THERMAL CYCLING

BACKGROUND

1. Technical Field

Embodiments of the invention relate generally to power converters. Other embodiments relate to controlling power converter thermal cycling.

2. Discussion of Art

Trains typically feature a number of cars that are pushed or pulled by a locomotive. The locomotive has traction wheels engaged with the track. In modern designs, electric wheel motors drive the traction wheels. The electric wheel motors are powered via electrical distribution from one or more engine-driven generators housed within the locomotive. The traction wheels and wheel motors can be reversibly configured, to also act as brakes for slowing the locomotive.

Similarly, in the mining industry, off-highway vehicles ("OHVs") usually employ electrically motorized wheels for propelling or retarding the vehicle. In particular, OHVs typically include a large horsepower diesel engine (or other engine) in conjunction with an alternator, a main traction inverter, and a pair of wheel drive assemblies housed within the rear tires of the vehicle. The diesel engine is directly associated with the alternator such that the diesel engine drives the alternator. The alternator powers the main traction inverter, in which semiconductor power switches commutate the alternator output current to provide electrical power to electric drive motors of the two wheel drive assemblies.

In both locomotive and OHV applications, solid state power converters are used to provide high voltage current from the generators or alternators to the wheel motors. Such power converters include inductive coils to step down the voltage as well as semiconductor power switches to commutate the current. Although the above-described applications are typical, it will be appreciated that power converters can be used in many other settings.

Generally, operation of a power converter is accomplished by applying alternately two different gate voltage levels to individual semiconductor power switches via corresponding gate drive units. It is a known problem that semiconductor power switches are subject to cyclic thermal stresses. While driven by a gate voltage, each power switch conducts significant current in a forward direction at a relatively small voltage drop across the switch. Despite the relatively low voltage across the forward-biased power switch, resistive heating nonetheless occurs. When gate voltage is removed, each semiconductor ceases to conduct (except for leakage current). Thus, with proper thermal design, a power switch not driven by gate voltage should cool toward ambient temperature.

Although durability is a consideration in semiconductor device design, electrical design constraints entail that the various layers of the semiconductor power switches are fabricated from materials having differing thermal properties; in particular, differing coefficients of thermal expansion. Thus, over time, thermal stress can cause mechanical failure modes such as delamination, debonding of terminals, or fatigue cracking. Thermal stress also can cause electrochemical failure modes such as current filamenting and Kirkendall void formation. Thermal stress effects can be rendered more predictable, and can be mitigated, by maintaining the heating/cooling cycle within a design envelope defined to minimize temperature swings despite continual ON/OFF cycling.

Therefore, in order to mitigate thermal stresses in semiconductor power switches, it is desirable to regulate thermal cycling.

BRIEF DESCRIPTION

An embodiment of the present invention relates to a method comprising obtaining at least one value indicative of a junction temperature of a power switch. The method further comprises selecting a gate drive voltage from a plurality of pre-determined gate drive voltage values, based on the at least one value that is obtained. The method further comprises providing the selected gate drive voltage to a gate of the power switch. The plurality of pre-determined gate drive voltage values are configured, when provided to the gate of the power switch as a function of respective junction temperature values corresponding to the gate drive voltage values, to reduce thermal cycling of the power switch relative to the thermal cycling that would be present during operation at a single gate voltage across plural junction temperatures.

According to another embodiment of the present invention, a method comprises receiving a first value indicative of a junction temperature of a power switch. The method further comprises providing a first gate drive voltage to the power switch, based on the first value. The method further comprises receiving a different, second value indicative of the junction temperature of the power switch. The method further comprises providing a different, second gate drive voltage to the power switch, based on the second value.

According to another embodiment of the present invention, a gate drive unit for a power switch comprises an output stage controllable to provide an adjustable gate drive voltage to an output terminal. The gate drive unit also comprises a signal connection configured to receive a value indicative of a junction temperature of a power switch; and a controller coupled to the signal connection and to the output stage. The controller is configured to command the output stage to adjust gate voltage in response to the value indicative of the power switch junction temperature.

In another embodiment, a power converter includes a plurality of gate drive units connected to a plurality of power switches. Each gate drive unit includes an output stage configured to provide adjustable gate voltage to at least one of the plurality of power switches, and a signal connection configured to receive a value indicative of a junction temperature of the at least one of the plurality of power switches. The power converter also includes at least one controller coupled to at least one signal connection and to at least one output stage. The controller is configured to control the at least one output stage to adjust gate voltage in response to the value indicative of the junction temperature.

DRAWINGS

The present invention will be better understood from reading the following description of non-limiting embodiments, with reference to the attached drawings, wherein below.

DETAILED DESCRIPTION

Reference will be made below in detail to exemplary embodiments of the invention, examples of which are illustrated in the accompanying drawings. Wherever possible, the same reference characters used throughout the drawings refer to the same or like parts. Although exemplary embodiments of the present invention are described with respect to power converters, embodiments of the invention are also applicable for use with power semiconductors generally.

Embodiments of the invention relate to methods for controlling semiconductor power switch junction temperatures across a range of operation conditions. Other embodiments of the invention relate to gate drive units that adjust power switch gate drive voltages to maintain power switch semiconductor junction temperature within a pre-determined operating range(s).

Figure 1:
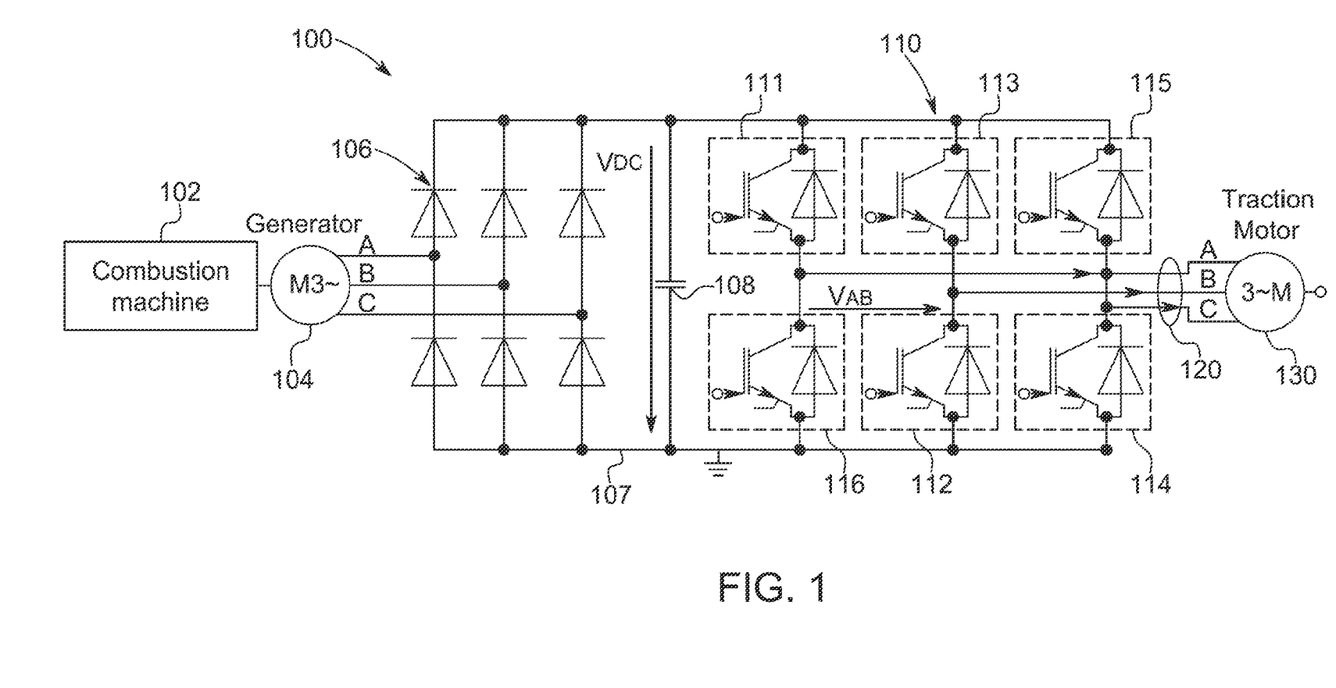
FIG. 1 is a schematic view of a diesel-electric traction system configured for use with gate drive units according to an embodiment of the present invention.

Accordingly, FIG. 1 shows in schematic view a diesel-electric traction system 100, in which a combustion machine 102 drives a three-phase generator 104. AC voltage produced by the generator 104 is rectified by a three-phase diode array 106, which delivers voltage Vdc, via a DC link 107, to a capacitor 108 and a power converter 110. The power converter includes switch modules 111, 112, 113, 114, 115, 116, which together commutate Vdc to deliver three-phase electrical power via output leads 120 (e.g., output bus bars) to a traction motor 130. Each switch module is controlled by an associated gate drive unit, as further discussed below with reference to FIG. 4.

It will be appreciated that the invention is not limited by the particular arrangement of the switch modules 111, 112, etc. to form a power converter 110. Rather, the present invention is equally applicable in other embodiments (not shown), including, for example, a single switch module or an array of switch modules used for electrical power conversion.

Figure 2:
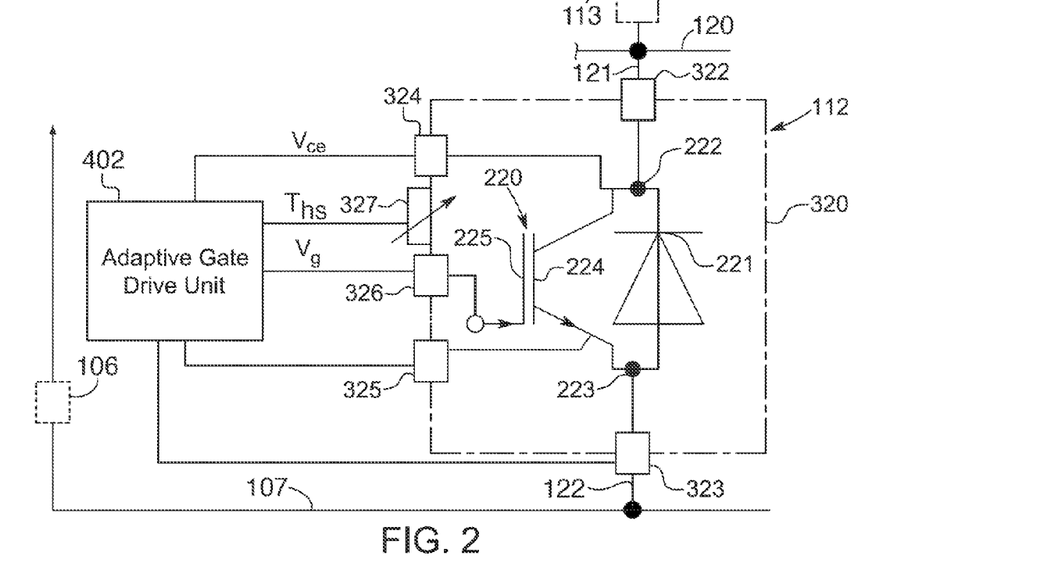
FIG. 2 is a schematic view of a switch module of the power converter shown in FIG. 1, including a semiconductor power switch and free wheel diode.
Figure 3:
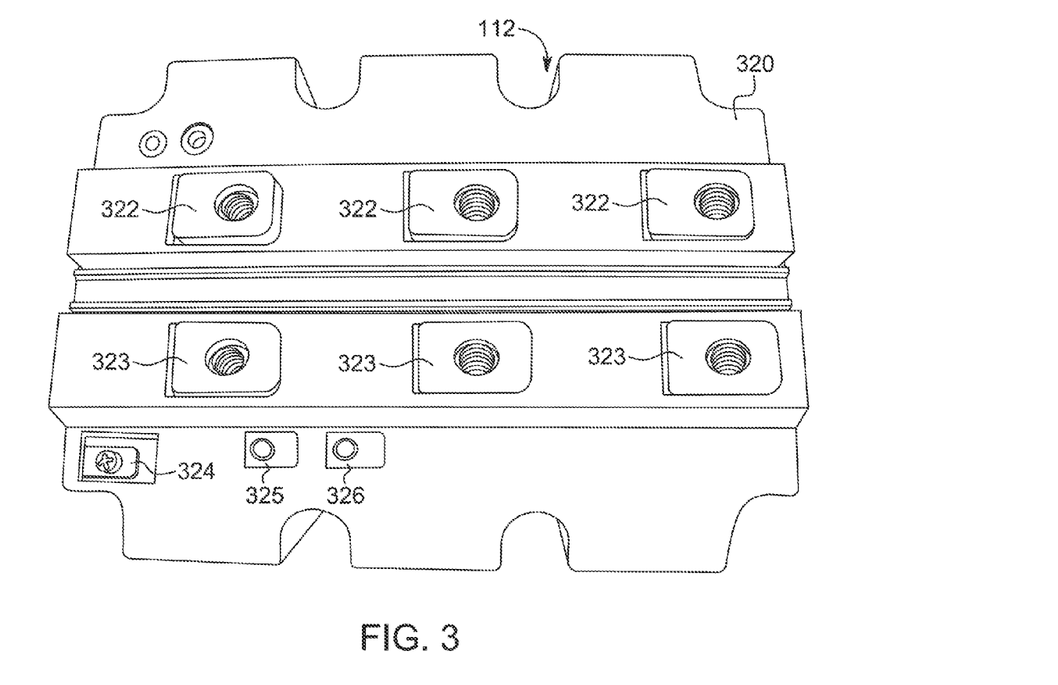
FIG. 3 is perspective view of an exterior of the switch module shown in FIG. 2.

FIG. 2 shows in schematic view the switch module 112, while FIG. 3 shows in perspective view a case 320 of the switch module 112. As shown in FIG. 2, the switch module 112 includes within its case 320 a voltage-controlled semiconductor power switch 220 and a free wheel diode 221. The power switch 220 has a collector 222 and an emitter 223 that are joined by a junction 224. At the junction 224, a gate 225 is connected to receive a gate drive voltage Vg and a gate current Ige from an associated gate drive unit 402. (Gate drive voltage refers to a voltage sufficient to activate the switch for delivering load current to a load. As should be appreciated, when a power switch is turned off, relatively small amounts of current may still be delivered to the load, but such current is incidental and not configured/intended/sufficient for powering the load.) The free wheel diode 221 is connected anti-parallel to the power switch 220, in other words, the anode of the free wheel diode is connected to the power switch emitter 223 while the cathode of the free wheel diode is connected to the power switch collector 222.

Although FIG. 2 specifically illustrates an exemplary embodiment wherein the power switch is an isolated gate bipolar transistor (IGBT), the present invention is also applicable to other voltage-controlled semiconductor devices, including, by way of non-limiting examples, bi-mode isolated gate transistors, reverse-conducting IGBTs, MOSFETs and JFETs. Additionally, although FIG. 2 shows a freewheel diode, it will be appreciated that other devices or structures can be substituted for leading reverse current. Although FIG. 2 shows a switch module packaging both a power switch and a freewheel diode, these components could be separately packaged. By way of non-limiting example, several power switches could be packaged together in a switch module, while associated diodes could be packaged together in a diode module.

FIGS. 2 and 3 show that the switch module case 320 includes several collector screw terminals 322, several emitter screw terminals 323, sensing or auxiliary terminals 324, 325, a control terminal 326, and a thermistor 327. Referring specifically to FIG. 2, the collector screw terminals 322 are connected with the power switch collector 222 inside the case 320, and are connected by power cabling 121 outside the case to one of the output leads 120 and to an electrically adjacent switch module 113. The emitter screw terminals 323 are connected inside the case 320 to the power switch emitter 223, and are connected by power cabling 122 outside the case to the DC link 107. The auxiliary terminals 324, 325 are provided for high-resistance sensing connections of the gate drive unit 402 to the power switch collector 222 and emitter 223, while the control terminal 326 is provided for supplying drive voltage from the gate drive unit 402 to the gate 225, as further discussed below with reference to FIG. 4.

In embodiments, one or more temperatures of a power switch 220 (e.g., power switch junction temperature) are determined by a real temperature sensor, or by an estimation based on operational conditions of the power switch. In the case of the former, the gate drive unit 402 also is connected to a real temperature sensor. For example, in FIGS. 2 and 6 a real temperature sensor is indicated as the thermistor 327, which is mounted to the switch module case 320. According to the embodiment shown in FIG. 2, the thermistor 327 is positioned to sense case temperature Tc by contact with the switch module case 320 proximate the region where the power switch 112 is mounted to the case. As will be appreciated, voltage across the thermistor 327 will vary in a manner directly indicative of case temperature Tc, and indirectly indicative of power switch junction temperature Tj.

In other embodiments, one or more temperatures of a power switch 220 (e.g., power switch junction temperature) are estimated based on operational conditions of the power switch. Power switch junction temperature can be estimated based on the following knowledge regarding the semiconductor junction temperature Tj: Tj is a function of ambient temperature Ta, design heat transfer parameters, duty cycle, switching frequency fs, DC link voltage Vdc, power converter output current Iload (in some embodiments, a per-phase current), steady state gate voltage Vg and time function of gate voltage Vg(t) during switching of the semiconductor device, among other factors. In one embodiment, at least one value indicative of the junction temperature of a power switch is obtained based on measurements of at least the DC link voltage and power converter output current.

The operation conditions like Vdc and Iload vary during operation, which causes variation in the steady state junction temperature. Rising Tj causes differential expansion of the power switch, establishing internal stress. Lowering the load lowers Ice, permitting the semiconductor junction to cool toward ambient, causing differential contraction which may relax or exacerbate internal stress (depending whether yield stress was exceeded in any layer during the preceding warm-up). Thus, cyclic thermal stresses are induced by changes in loading and temperature, not by the magnitudes of load current or of junction temperature. Cyclic thermal stress can lead to mechanical fatigue failure modes such as, by way of example, delamination, debonding of terminals, or fatigue cracking. Moreover, rapid temperature cycling can lead to electrochemical fatigue failure modes such as current filamenting and formation of Kirkendall voids at the semiconductor junction, via a phenomenon of current crowding at local hot spots.

In order to mitigate the problems consequent to thermal cycling, in embodiments, power switch parameters are controlled such that Tj (junction temperature) is maintained during operation within acceptable limits According to one aspect of the present invention, a gate drive unit is configured to adjust gate voltage for maintaining conduction and/or switching losses, and associated temperature changes, within pre-determined design envelopes, e.g., to minimize magnitude and rate of junction temperature changes during power operations.

Figure 4:
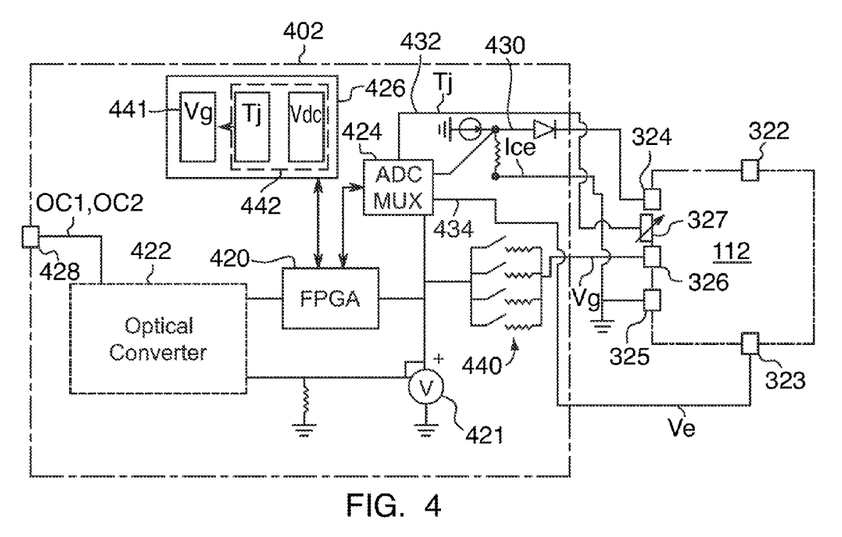
FIG. 4 is a schematic view of a gate drive unit according to an embodiment of the present invention.

Accordingly, FIG. 4 shows in schematic view a gate drive unit 402, connected with the switch module 112, according to an embodiment of the invention. The gate drive unit 402 includes a programmable logic controller (PLC) 420, which in one embodiment can be an FPGA (field programmable gate array). Alternatively, the gate drive unit 402 may include a type of controller other than a PLC. The gate drive unit 402 also includes a DC power supply 421, a signal converter 422 (e.g., optical converter), a multiplexed (MUX) ADC (analog digital signal converter) 424, a memory 426, and several signal connections. In particular, the signal converter 422 receives and transmits data including operator control signals OC1, OC2, etc. via a control/data signal connection 428 (e.g., fiber-optic connection or other communication link), while the PLC or other controller 420, in one embodiment, directly receives measured values of Vce, Tc, and Ice from sensor signal connections 430, 432, 434 via the ADC 424. In another embodiment, Ice is estimated based on the voltage across the internal stray inductance of the switch module, which is measured as voltage between auxiliary terminal 325 and emitter terminal 323.

Based on the measured values and/or the received data, the PLC or other controller 420 searches among a plurality of pre-determined gate drive voltage values 441 that are stored in a lookup table 442 within the memory 426. The PLC or other controller 420 then controls an output stage 440 to deliver a switch-ON static gate voltage Vg (gate drive voltage) selected from the plurality of pre-determined values. In one aspect of the present invention, the stored values of Vg are pre-determined according to a function of Tj. In another aspect of the present invention, the stored values of Vg are pre-determined according to linear functions of Tc, Iload, and/or Vce. In yet another aspect of the present invention, the stored values of Vg are pre-determined according to one or more operator control signals OC1, OC2, etc. that are received at the PLC or other controller 420 via the control/data signal connection 428 and the signal converter 422. For example, operator control signal OC1 may represent a reference value of Tj received from a controller (not shown) that is separate from any of the local gate drive units. In yet another aspect of the invention, the stored values of Vg may be time sequenced arrays or time functions, each corresponding to one or more of a plurality of pre-determined ranges of one or more operating parameters, such as Tj, Iload, Vdc, and/or OC1, OC2, etc.

Therefore, in certain embodiments, thermal cycling (temperature swings) can be mitigated by adapting a static target value of gate drive voltage. At the end of a switching event, Vce drops down to a level of only a few volts. This is the forward voltage drop which determines the conduction losses of the device. The static gate drive voltage level impacts the forward voltage drop. The lower the gate drive voltage level, the higher the forward voltage drop for the same current. The standard gate drive voltage level is +15V. In the adaptive case, the gate drive voltage can be decreased, e.g., to 12V, by adjusting gate drive resistance at the output stage 440, thereby increasing the conduction losses of the IGBT or other power switch. Again, increased conduction losses mitigate power semiconductor junction cool down during operation conditions with low loading of the device. In other embodiments, thermal cycling can be controlled by adapting the gate voltage slew rate as well as the gate voltage target value. Moreover, by adapting Vg, a gate drive unit according to an embodiment of the present invention can level out thermal and electrical stresses throughout a wide range of operation conditions, thereby reducing thermal fatigue of power switches that are controlled by the gate drive unit.

Variation of the static gate drive voltage level is accomplished by adapting the supply voltage for the output stage on the gate drive unit. For example, in the embodiment shown in FIG. 4, the voltage supply 421 is programmable to control the static switch-ON gate voltage (gate drive voltage). In some embodiments an adjustable linear voltage regulator is used and a voltage divider ratio for a reference pin of the voltage regulator is modified, e.g., by switching a resistor with a transistor or using a programmable potentiometer. FIG. 4 also shows the output stage 440 is programmable and including a plurality of standard resistive output stages connected in parallel. Each of the parallel resistive output stages consists of a MOSFET, BJT, or other semiconductor switch connected in series with a resistor between variable DC power supply 421 and the gate voltage terminal 326 connected to the power switch. The time function of the gate voltage while switching is controlled by the PLC or other controller 420 via the programmable output stage 440 and/or via the programmable voltage supply 421. In another embodiment (not shown) an adjustable buck or boost converter is used and the voltage divider ratio for the reference pin is modified, e.g., by switching a resistor with a transistor or using a programmable potentiometer.

According to another aspect of the invention, the gate drive unit 402 controls the slew rate of the collector-emitter current Ice during switch ON and switch OFF transients, by controlling the slew rate of the gate drive voltage Vg according to a time function selected by the PLC or other controller 420 from the memory 426. In this case, switching losses are adjusted to maintain Tj within a desired envelope.

Therefore, in certain embodiments, thermal cycling can be controlled by adapting the slew rate or time function of gate drive voltage Vg. The gate voltage slew rate controls the slew rate of switch-on current Ice, therefore, controls the switching losses. In a case where a switching transient is slowed down (by increased value of the gate resistor output stage), the switching losses are substantially increased. However, the static target level of the gate drive voltage is in both cases +15V. Only the slew rate is adapted with the gate resistor. The advantage is that by boosting switching loss, power semiconductor junction cool down is mitigated during operation conditions with low loading of the device.

In one aspect of the present invention, the stored values of Vg 441 can be pre-determined as linear functions of Tj corresponding to pre-defined ranges of Vdc. For example the stored values of Vg 441 may be defined as a first linear function of Tj corresponding to a first range of Vdc, a second linear function of Tj corresponding to a second range of Vdc, etc. In some embodiments of the present invention, one or more of the linear functions may be constant-valued for a given range of Vdc, across the design range of Tj.

In other embodiments, the stored values of Vg are pre-determined as functions of Tj. Moreover, the stored values of Vg may be step-varying time functions, which may be pre-determined as functions of Tc, Iload, and/or Vdc, corresponding to pre-defined values of the one or more operator control signals OC1, OC2, etc. In yet another aspect of the present invention, the stored values of Vg are pre-determined as target values corresponding to pre-defined values of one or more operator control signals OC1, OC2, etc. that are received at the PLC 420 from a separate controller, via the control/data signal connection 428 and the signal converter 422.

The stored values of Vg can be calculated based on empirical data indicating the switching behavior of each power switch, at various values of power switch junction temperature Tj, as further discussed below with reference to FIGS. 6 and 7.

In embodiments, a thermal model is implemented in the gate drive unit that estimates the junction temperature Tj based on measurement input like case temperature, Vdc, Ice, and predetermined system parameter like Rthjc. Based on the estimated value of the junction temperature Tj an appropriate value of gate drive voltage Vg and/or gate voltage time function Vg(t) is selected. In yet another aspect the thermal model is implemented in a separate controller (not shown), which can select and communicate to the gate drive unit a reference value, indicative of junction temperature Tj, that is used by the gate drive unit for selecting an appropriate value of gate voltage Vg and/or gate voltage time function Vg(t). For example, at the beginning of minute 1 a first gate drive voltage target value Vg(0) may be chosen as 15 V based on temperature and Vdc, and used until minute 2. At the end of minute 1, based on temperature, a second gate drive voltage target Vg(1) may be chosen as 14 V and used until minute 3. The gate voltage time function Vg(t) could be transmitted to the gate drive unit 402 from an external controller, via the control/data signal connection 428, as an array of time and voltage values: {(1 min, 15V), (2 min, 14V), ... }. Thus the PLC 420 can raise or lower switching losses, in order to minimize thermal transients at the power switch junction 224.

In yet another embodiment, an operation condition, such as load current or an operator control input, can be measured at a central controller (not shown), which can select and communicate to the gate drive unit a control signal for selecting an appropriate value of gate drive voltage Vg and/or gate voltage time function Vg(t).

In embodiments, the gate drive unit 402 is operated for temperature control, either in closed or open loop mode. In closed loop mode, the PLC or other controller 420 selects Vg based on a concurrently measured or estimated value of Tj. In open loop mode, the PLC 420 selects Vg based on a measured or estimated value of another parameter that can be expected to affect Tj in a predictable way. For example, the PLC 420 can select a higher value for Vg, based on receiving an operator control signal OC1 that requires speeding up the motor 130.

On the other hand, while the traction motor 130 is expected to operate at steady state, the PLC or other controller 420 can select values for Vg based on open loop estimates of Tj. For example, Tj can be estimated based on ambient temperature, design heat transfer parameters, duty cycle, DC-link voltage, and time since startup of the diesel electric traction system 100. During traction system warm up, the PLC 420 can increment Vg according to a pre-determined ramp function. Once Tj is predicted to be at steady state, the PLC 420 can store and implement a steady state value of Vg.

As another example, Tj can be estimated based on case temperature, design heat transfer parameters, and measured values of Ice and Vdc. Other variations will be apparent to those of ordinary skill.

Generally, a plurality of gate drive voltage values and/or time functions may be determined based on known parameters of the power switch, including: conducting and non-conducting collector to emitter resistances and gate to emitter resistances as functions of junction temperature; internal inductances; collector to emitter current as a time function of junction temperature and of gate drive voltage; and cooling capacity. Additionally, the plurality of gate drive voltage values and/or time functions may be determined based on pre-defined target values of operational parameters, e.g., based on a target value for power dissipation during a switching transient at a pre-determined junction temperature.

Figure 6:
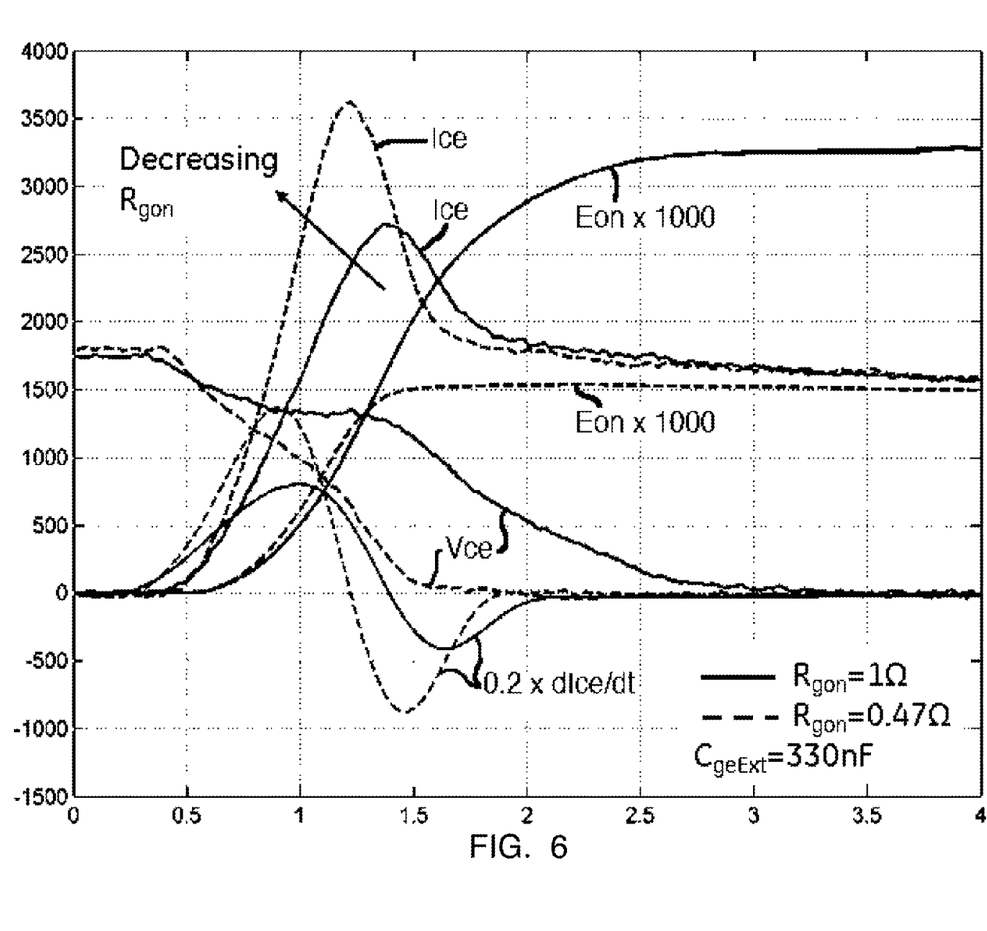
FIG. 6 is a graphical view of switching transients for various values of gate drive resistance under a given power switch junction temperature.

FIG. 6 shows values of collector to emitter voltage and current (Vce and Ice) for several switching transients carried out at different target values of gate drive voltage Vg, under a given junction temperature Tj=138 C. Based on these time transient values it is possible to calculate switching transient power dissipation for each target value of Vg, under the given junction temperature Tj. Based on the cooling capacity of the power switch, it is possible to determine what target value of gate drive voltage should be chosen to achieve a target rate of change in the power switch junction temperature. Typically, the target rate of change will be zero change (thermal steady state) so as to minimize thermal cycling. However, electrical design constraints may require minimal variation of the junction temperature Tj (where "minimal" means less than about five (5) percent), and such variation remains within the intended scope of the invention.

Figure 7:
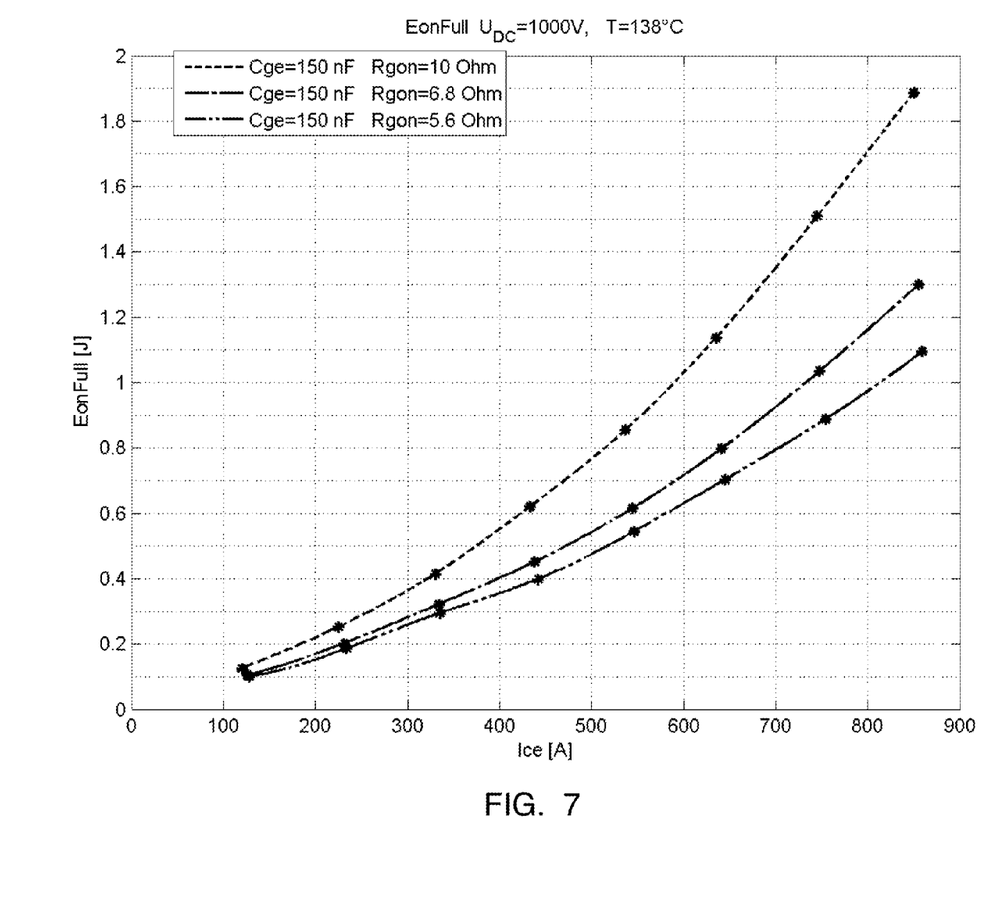
FIG. 7 is a graphical view of power dissipation for various values of gate drive resistance under a given power switch junction temperature.

FIG. 7 shows power dissipation for various values of gate drive resistance Rgon, at a junction temperature Tj=138 C. Controlling the parallel resistor network at output stage 440, to select a lower value for Rgon, results in higher value of gate drive voltage Vg. This higher value of gate drive voltage, in turn, produces lower switching losses Eon. For example, FIG. 7 shows power switching losses Eon that scale approximately inversely according to gate drive resistance Rgon. Another mode for adjusting gate drive voltage Vg would be to provide a programmable current source at output stage 440, in place of the resistor network.

Empirical data, as shown in FIGS. 6 and 7, will vary among power switch types or models and even among individual power switches. Thus, in select embodiments, empirical data are obtained at the target operation temperature of each power switch at commissioning, and a power switch identifier is used at a central controller to select the stored values 441 to be programmed in the gate drive unit 402. The target operation temperature typically is about ninety (90) percent of the maximum allowed junction temperature and is therefore also dependent on the type or model of power switch. Empirical data also can be obtained or estimated for other junction temperature values, such that power switch junction temperature can be used among other parameters for selecting from the lookup table 441 a target value for Vg.

In select embodiments, empirical power dissipation data also can be determined for steady state conduction through a power switch, and steady state Vg can be selected the same or different from target Vg for switching.

Figure 5:
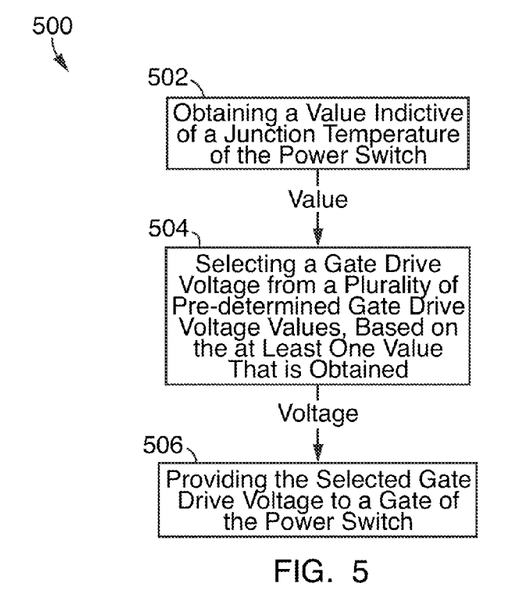
FIG. 5 is a flowchart of a method for controlling a power switch, according to an embodiment.

In one embodiment, thermal cycling of a power switch is reduced by a method 500 (e.g., a method for controlling the power switch) as shown in FIG. 5. The method comprises, at 502, obtaining a value indicative of a junction temperature of the power switch. (Obtaining may include a direct or indirect measurement, an estimation based on conditions/parameters of the power switch in operation, receiving data/information or other signals, etc.) The method further comprises, at 504, selecting a gate drive voltage from a plurality of pre-determined gate drive voltage values, based on the at least one value that is obtained. The method further comprises, at 506, providing the selected gate drive voltage to a gate of the power switch. The plurality of pre-determined gate drive voltage values are configured, when provided to the gate of the power switch as a function of respective junction temperature values corresponding to the gate drive voltage values (e.g., for a first junction temperature value or range of values, there is a first gate drive voltage, for a second, different junction temperature value or range of values, there is a second, different gate drive voltage, and so on), to reduce thermal cycling of the power switch relative to the thermal cycling that would be present during operation at a single constant gate voltage across plural junction temperatures.

In another embodiment of the method, the method comprises identifying a range of an operating parameter corresponding to the obtained value indicative of the junction temperature of the power switch. The method further comprises selecting a pre-determined power switch gate drive voltage, based on the identified range of the operating parameter, and providing the selected gate chive voltage to the gate of the power switch, to control power switch junction temperature.

As noted, a gate drive voltage for driving a power switch is selected from the plurality of pre-determined gate drive voltage values based on the at least one obtained value indicative of a junction temperature of the power switch. The at least one value indicative of the junction temperature may be obtained by way of a measurement of power switch temperature. Power switch temperature may be measured by contact at an associated case, or by an optical or other sensor proximate the power switch junction. Alternatively or additionally, the junction temperature may be estimated based on parameters/conditions of the power switch in operation, as described above. Thus, a value can be indicative of the junction temperature due to the junction temperature being determinable or estimable based on the value, even if the value is not a direct temperature measurement, or the value can be a direct temperature measurement of the junction or of another part of the power switch.

For example, a value indicative of junction temperature may be obtained based on measurements of at least a DC link voltage of a DC link to which the power switch is attached, and a power converter output current of a power converter that includes the power switch. As another example, a value indicative of junction temperature may be obtained based on an estimate of load current of a load that is at least partially provided with the load current by the power switch. Alternatively, or additionally, a gate drive voltage may be selected based on an identified range of load current. For example, the range of load current may be identified prior to switching on the power switch. In another embodiment, a value indicative of junction temperature may be estimated based on an operator control signal. Alternatively, the gate drive voltage may be adjusted to control power switch junction temperature, based on a reference value provided from a separate controller.

According to an embodiment of the present invention, a gate drive unit for a power switch includes an output stage controllable to provide an adjustable gate drive voltage to an output terminal, a signal connection configured to receive a value indicative of a junction temperature of a power switch, and a controller coupled to the signal connection and to the output stage. The controller is configured to control the output stage to adjust the gate drive voltage in response to the value indicative of the power switch junction temperature.

For example, the controller may be configured to control the output stage, based on searching a lookup table to identify one or more pre-determined values of gate drive voltages corresponding to the value indicative of the power switch junction temperature. In some embodiments, the lookup table may include a plurality of gate voltage time functions corresponding to pre-defined ranges of voltages across a power switch driven by the output stage. The lookup table may also include a plurality of gate drive voltage time functions corresponding to pre-defined ranges of current through a power switch driven by the output stage. In yet other embodiments, the lookup table may include a plurality of gate voltage time functions corresponding to pre-defined ranges of power switch junction temperature. The value indicative of the power switch junction temperature may be a reference value received from a separate controller, and the lookup table may include a plurality of gate drive voltage time functions corresponding to pre-defined reference values.

According to another embodiment, a power converter includes a plurality of gate drive units connected to a plurality of power switches. Each gate drive unit includes an output stage configured to provide an adjustable gate drive voltage to at least one power switch of the plural power switches. Each gate drive unit also includes a signal connection for receiving a value indicative of a junction temperature of the at least one power switch. The power converter further includes at least one controller coupled to at least one signal connection and to at least one output stage. The controller is configured to control the at least one output stage to adjust the gate drive voltage in response to the value indicative of the power switch junction temperature. For example, the controller may be configured to control the output stage, based on searching a lookup table to identify pre-determined values of gate drive voltages corresponding to the received value indicative of the power switch junction temperature. (The lookup table may include plural different pre-determined gate drive voltage values corresponding to different power switch junction temperatures.) in some embodiments, the lookup table may include a plurality of gate drive voltage time functions corresponding to pre-defined ranges of voltage across the at least one power switch. The lookup table may include a plurality of gate drive voltage time functions corresponding to pre-defined ranges of current through the at least one power switch. In yet other embodiments, the lookup table may include a plurality of gate drive voltage time functions corresponding to pre-defined ranges of the power switch junction temperature. In certain embodiments, the value indicative of the power switch junction temperature may be a reference value received from a separate controller, and the lookup table may include a plurality of gate drive voltage time functions corresponding to pre-defined reference values.

Another embodiment relates to a method (e.g., method for controlling a semiconductor power switch) comprising receiving a first value indicative of a junction temperature of a power switch. The method further comprises, based on the first value, providing a first gate drive voltage to the power switch. The method further comprises receiving a different, second value indicative of the junction temperature of the power switch (e.g., at a later point in time, the second value reflecting a change in the junction temperature of the power switch). The method further comprises, based on the second value, providing a different, second gate drive voltage to the power switch.

As will be readily appreciated, in embodiments of the present invention, a gate drive voltage can be adapted, based on a value indicative of power switch junction temperature, to provide for open loop or closed loop control of power switch junction temperature within design ranges of selected operational parameters such as, for example, DC-link voltage or load current. Control of power switch junction temperature can mitigate thermal cycling effects across operational ranges of the selected operational parameters, such that durability and reliability of the controlled power switch can be enhanced by provision of a gate drive unit according to embodiments of the present invention.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. While the dimensions and types of materials described herein are intended to define the parameters of the invention, they are by no means limiting and are exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, terms such as "first," "second," "third," "upper," "lower," "bottom," "top," etc. are used merely as labels, and are not intended to impose numerical or positional requirements on their objects. Further, the limitations of the following claims are not written in means-plus-function format and are not intended to be interpreted based on 35 U.S.C. §122, sixth paragraph, unless and until such claim limitations expressly use the phrase "means for" followed by a statement of function void of further structure.

This written description uses examples to disclose several embodiments of the invention, including the best mode, and also to enable one of ordinary skill in the art to practice the embodiments of invention, including making and using any devices or systems and performing any incorporated methods. The patentable scope of the invention is defined by the claims, and may include other examples that occur to one of ordinary skill in the art. Such other examples are intended to be within the scope of the claims if they have structural elements that do not differ from the literal language of the claims, or if they include equivalent structural elements with insubstantial differences from the literal languages of the claims.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Since certain changes may be made in the above gate drive unit and method for controlling thermal cycling, without departing from the spirit and scope of the invention herein involved, it is intended that all of the subject matter of the above description or shown in the accompanying drawings shall be interpreted merely as examples illustrating the inventive concept herein and shall not be construed as limiting the invention.

What is claimed is:

1. A method comprising, in a gate drive unit of a power converter during operation of the power converter:
   obtaining a first value indicative of a junction temperature of a power switch within the power converter;
   obtaining a second value indicative of the junction temperature of the power switch;
   selecting a gate drive voltage time function for the power switch from a plurality of pre-determined gate drive voltage time functions, based on at least the first and second values indicative of the junction temperature of the power switch; and
   reducing thermal cycling of the power switch, relative to the thermal cycling that would be present during operation at a constant gate voltage, by providing gate drive voltage to a gate of the power switch, according to the selected gate drive voltage time function wherein reducing thermal cycling includes providing the gate voltage according to the selected gate drive voltage time function by which switching losses are increased above the losses that would be present during operation at the constant gate voltage.

2. A method as claimed in claim 1, wherein at least one of the values indicative of the junction temperature is obtained based on measurements of at least a DC link voltage of a DC link to which the power switch is attached and a power converter output current of a power converter that includes the power switch.

3. A method as claimed in claim 1, wherein at least one of the values that is obtained is a measurement of a power switch temperature of the power switch at an associated case.

4. A method as claimed in claim 1, wherein at least one of the values that is obtained is an estimate of an output load current into a load that is at least partially provided with the load current by the power switch.

5. A method as claimed in claim 1, wherein the gate drive voltage time function is selected based also on an updated value of an operator control signal that is received at the gate drive unit while the gate drive unit is obtaining the first and second values indicative of the junction temperature.

6. A method as claimed in claim 1, wherein reducing thermal cycling of the power includes providing gate voltage according to a gate voltage time function by which gate voltage is reduced at a time when switching losses otherwise would diminish.

7. A gate drive unit comprising:
   an output stage controllable to provide an adjustable gate drive voltage to an output terminal;
   a signal connection configured to receive a sequence of values of a parameter indicative of a junction temperature of a power switch; and
   a controller coupled to the signal connection and to the output stage, the controller configured to control the output stage to adjust the gate drive voltage in response to the sequence of values of the parameter indicative of the power switch junction temperature so as to mitigate temperature cycling that would be present in case the gate drive voltage was not adjusted wherein the controller is configured to mitigate temperature cycling by reducing gate voltage at a time when switching losses otherwise would diminish.

8. A gate drive unit as claimed in claim 7, wherein the controller is configured to control the output stage based on searching a lookup table to identify one or more pre-determined values of gate drive voltages corresponding to at least one of the sequence of values of the parameter indicative of the power switch junction temperature.

9. A gate drive unit as claimed in claim 8, wherein the lookup table includes a plurality of gate drive voltage time functions corresponding to pre-defined ranges of voltages across the power switch driven by the output stage.

10. A gate drive unit as claimed in claim 8, wherein the lookup table includes a plurality of gate drive voltage time functions corresponding to pre-defined ranges of current through the power switch driven by the output stage.

11. A gate drive unit as claimed in claim 8, wherein the lookup table includes a plurality of gate drive voltage time functions corresponding to pre-defined ranges of power switch junction temperatures.

12. A gate drive unit as claimed in claim 8, wherein the controller is configured to adjust the gate drive voltage according to an updated value of an operator control signal that is received at the gate drive unit while the gate drive unit is receiving the sequence of values.

13. A power converter comprising:
   at least one gate drive unit comprising an adjustable output stage configured to provide an adjustable gate drive voltage to at least one of a plurality of power switches composing the power converter; and
   at least one controller coupled to the adjustable output stage of the at least one gate drive unit, the controller configured to control the adjustable output stage to adjust the gate drive voltage in response to receiving a sequence of values indicative of a junction temperature of the at least one of the plurality of power switches so as to mitigate temperature cycling that would be present in case the gate drive voltage was not adjusted wherein the controller is configured to mitigate temperature cycling by reducing gate voltage at a time when switching losses otherwise would diminish.

14. A power converter as claimed in claim 13, wherein the controller is configured to control the adjustable output stage based on searching a lookup table to identify pre-determined values of gate drive voltages corresponding to the received value indicative of the junction temperature.

15. A power converter as claimed in claim 14, wherein the lookup table includes a plurality of gate drive voltage time functions corresponding to pre-defined ranges of voltages across the at least one of the plurality of power switches.

16. A power converter as claimed in claim 14, wherein the lookup table includes a plurality of gate drive voltage time functions corresponding to pre-defined ranges of current through the at least one of the plurality of power switches.

17. A power converter as claimed in claim 14, wherein the lookup table includes a plurality of gate drive voltage time functions corresponding to pre-defined ranges of the junction temperature of the at least one of the plurality of power switches.

18. A power converter as claimed in claim 14, wherein the controller is configured to adjust the gate drive voltage according to an updated value of an operator control signal that is received at the gate drive unit while the gate drive unit is receiving the sequence of values.

* * * * *

UNITED STATES PATENT AND TRADEMARK OFFICE
CERTIFICATE OF CORRECTION

| | |
|---|---|
| PATENT NO. | : 8,923,022 B2 |
| APPLICATION NO. | : 13/469986 |
| DATED | : December 30, 2014 |
| INVENTOR(S) | : Zoels et al. |

It is certified that error appears in the above-identified patent and that said Letters Patent is hereby corrected as shown below:

In the specification

Column 5, Line 11, delete "limits" and insert -- limits. --, therefor.

Column 7, Line 35, delete "V" and insert -- V, --, therefor.

Column 9, Line 25, delete "chive" and insert -- drive --, therefor.

Column 10, Line 40, delete "in some" and insert -- In some --, therefor.

Signed and Sealed this
Fifth Day of May, 2015

Michelle K. Lee
*Director of the United States Patent and Trademark Office*